United States Patent

Nishikawa et al.

[11] Patent Number: 5,865,365
[45] Date of Patent: Feb. 2, 1999

[54] METHOD OF FABRICATING AN ELECTRONIC CIRCUIT DEVICE

[75] Inventors: Toru Nishikawa; Ryohei Satoh; Masahide Hara, all of Yokohama; Tetsuya Hayashida, Tokyo; Mitugu Shirai, Hatano; Osamu Yamada, Hiratsuka; Hiroko Takehara; Yasuhiro Iwata, both of Yokohama; Mitsunori Tamura, Hatano; Masahito Ijuin, Fujisawa, all of Japan

[73] Assignee: Hitachi, Ltd., Tokyo, Japan

[21] Appl. No.: 761,430

[22] Filed: Dec. 6, 1996

Related U.S. Application Data

[63] Continuation-in-part of Ser. No. 578,054, Dec. 22, 1995, which is a continuation of Ser. No. 240,320, May 10, 1994, abandoned, which is a division of Ser. No. 890,255, May 29, 1992, Pat. No. 5,341,980, which is a continuation-in-part of Ser. No. 656,465, Feb. 19, 1991, abandoned.

[51] Int. Cl.[6] ................................................. H05K 3/34
[52] U.S. Cl. .................................... 228/223; 228/180.22
[58] Field of Search .................... 228/180.22, 205–207, 228/219–221, 223, 224; 148/23, 25; 29/841, 855–856

[56] References Cited

U.S. PATENT DOCUMENTS

| 5,129,962 | 7/1992 | Gutierrez et al. | 148/23 |
| 5,564,617 | 10/1996 | Degani et al. | 228/180.22 |
| 5,616,164 | 4/1997 | Ochiai et al. | 75/342 |

FOREIGN PATENT DOCUMENTS

| 2-25291 | 1/1990 | Japan . |
| 2-290693 | 11/1990 | Japan . |

*Primary Examiner*—Samuel M. Heinrich
*Attorney, Agent, or Firm*—Fay, Sharpe, Beall, Fagan, Minnich & McKee

[57] ABSTRACT

A method of soldering used in fabricating an electronic circuit device employs an organic material supplied to at least one of the connecting members to be bonded. The connecting members are positioned in an oxidizing atmosphere, and heated in a nonoxidizing atmosphere to remove oxide and/or contamination layers present on the surface of presoldered portions or metallized bonding portions. By this method, fluxless soldering is performed, positional shifts are reduced, and high reliability of the soldering connections with reduction in residues after reflow are obtained.

37 Claims, 5 Drawing Sheets

METHOD OF FABRICATING AN ELECTRONIC CIRCUIT DEVICE

CROSS-REFERENCE TO RELATED APPLICATION

This application is a continuation-in-part of copending U.S. patent application Ser. No. 08/578,054, filed on Dec. 22, 1995, which is a continuation application of U.S. patent application Ser. No. 08/240,320, filed on May 10, 1994, now abandoned, the entire content of which is hereby incorporated by reference. U.S. patent application Ser. No. 08/240,320 is a divisional of U.S. patent application Ser. No. 07/890,255, filed May 29, 1992, now U.S. Pat. No. 5,341,980, which is a continuation-in-part of U.S. patent application Ser. No. 07/656,465, filed Feb. 19, 1991, now abandoned.

BACKGROUND OF THE INVENTION

Field of the Invention

The present invention relates generally to a method of fabricating an electronic circuit device, and, more particularly, to a method of soldering leads of circuit elements, face-mounted circuit elements, and the like on an electronic circuit board in a fluxless manner.

Conventionally, soldering circuit elements to an electronic circuit board typically requires flux to enhance the flow of the solder as the circuit element is being mounted to the board. However, the flux leaves a residue after the soldering operation is completed, which residue must be removed by cleaning. A fluxless solder paste has been developed, which enables a soldering operation to be performed without subsequent cleaning (see, for example, Japanese Patent Laid-Open Nos. Hei 2-25291 and Hei 2-290693).

In Japanese Patent Laid-Open No. Hei 2-25291, a solder paste used in a reducing atmosphere is disclosed, which comprises a solder powder and a binder containing an alcohol. The method does not generate a residue because the solder paste contains no solid component such as an active agent or a resin. Moreover, the boiling point of the alcohol contained in the binder lies within a boundary region (paste region) between a solidus line and a liquidus line in a phase diagram of the solder powder. Thus, the alcohol boils and evaporates when the solder arrives at a semimolten state when heated. Consequently, the method also solves a prior problem suffered by a solder paste containing an alcohol having a boiling point below the solidus line, wherein solder balls are scattered upon evaporation of the alcohol.

Nevertheless, this method exposes the solder surface to the atmosphere when the solder is melted for bonding, upon evaporation of the alcohol. Thus, a reducing atmosphere (such as hydrogen gas) is required for the solder operation, to prevent oxidation of the solder. Moreover, the method has a limited reliability for high-density packaging because the solder paste is typically supplied to a bonding portion by a coating technique such as printing, which has a limited accuracy.

In Japanese Patent Laid-Open No. Hei 2-290693, a solder paste is disclosed for use in an inert atmosphere. The solder paste comprises a fine solder powder and an alcohol having a boiling point higher than the melting point of the solder. Thus, the alcohol is present throughout the soldering process. In other words, the bonding portion is shielded from the atmosphere by the alcohol upon soldering, so that the soldering can be carried out in the inert atmosphere. Consequently, the method is advantageous in eliminating the necessity of a special atmosphere such as the reducing atmosphere required by the method of JP 2-25291. However, the method of JP 2-290693 is also typically employed in a coating technique such as printing, and thus has a reliability that is limited by the accuracy of the printing technique.

SUMMARY OF THE INVENTION

As noted above, the prior art has suffered in terms of reliability in bonding for high-density packaging because the supplying accuracy is limited for bonding portions arranged at a fine and narrow pitch. Accordingly, a general object of the present invention is to provide an improved method of fabricating an electronic circuit device, particularly for high-density soldering of electronic parts.

A specific object of the present invention is to provide a method of fabricating an electronic circuit device, including fluxless soldering of members to be bonded, such as an electronic part and a circuit board. Another specific object of the present invention is to provide a method of temporarily fixing members to be bonded in a fluxless manner. A further specific object of the present invention is to provide a highly reliable bonding method for fabricating an electronic circuit device in which residue from the bonding of electronic parts is eliminated, thereby omitting the need for a post-bonding cleaning process.

To achieve these and other objects, according to a preferred embodiment of the present invention, the solder is not supplied in the form of a solder paste, but it is previously provided to at least one of a connecting terminal of an electronic part and an electrode of a wiring circuit board, for example, in the form of solder plating or fusion of a ball-like solder. An organic material is supplied to the board upon bonding for positioning and temporarily fixing the electronic part. Then, the solder is heated and melted, and the bonding is completed with the surface of the bonding portion covered by the organic material.

According to another preferred embodiment of the present invention, a method of fabricating an electronic circuit device includes a step of discontinuously applying an organic material only to bonding portions when an electronic part is positioned on a board. In other words, the organic material is not spread over the entire board surface, but is limited to selected locations. To achieve this effect, the organic material is supplied so that the thickness thereof is no more than two-thirds the height h of a solder previously supplied to a connecting terminal of an electronic part or a wiring circuit board electrode. In this example, formation of the coating film of the organic material is substantially limited to each connecting portion. However, although the perfect independence of application of the organic material to each connecting portion may be an objective of this embodiment, the embodiment also contemplates the application of the organic material so as to be partially continuous between base portions of adjacent electrodes of the board or adjacent connecting terminals of the electronic part by means of a thin film formed therebetween. Nevertheless, the organic material is intended to be "independent", that is, discontinuous between main portions of the adjacent bonding portions.

The use of an organic material as outlined above enables the soldering operation to be performed in air. However, the soldering operation is preferably performed in an inert gas atmosphere of, for example, He, Ar, or $H_2$.

DETAILED DESCRIPTION OF THE PREFERRED EMBODIMENTS

Embodiment 1

FIGS. 1(a)–1(e) illustrate an embodiment of the invention, in which a semiconductor integrated circuit (for example, an LSI chip) is mounted on a ceramic board to create an electronic circuit device.

Figure 1A:
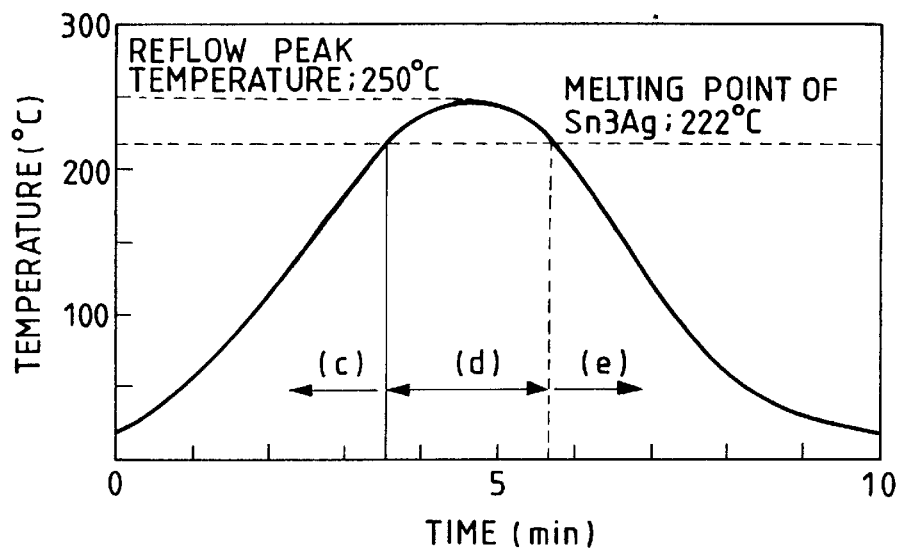
FIG. 1(a) is a graph showing a reflow temperature profile of a solder.

FIG. 1(a) shows the reflow temperature profile of a solder (in this case, $Sn_3Ag$). In general, according to this embodiment, the reflow peak temperature of the solder is set to be higher than the melting point (liquidus line temperature) of the solder by 20°–30° C. to be certain that the solder is melted. In the case of $Sn_3Ag$ solder, which has a melting point of 222° C., the peak temperature is set at 250° C. Moreover, the method is performed so that the solder is maintained in the molten state (i.e., above its melting point) for a period of one to two minutes. The reflow temperature profile is not limited to that shown in FIG. 1(a), but may be modified with the objective that the solder is uniformly heated in accordance with the heat capacity of the sample to be bonded.

In the embodiment shown in FIGS. 1(b)–1(e), an organic material is selected such that 2-phenoxyethanol (boiling point: 245° C.) is used for reflow in an Ar or $N_2$ atmosphere; and triethylene glycol (boiling point: 285° C.) is used for reflow in an He atmosphere.

Figure 1B:
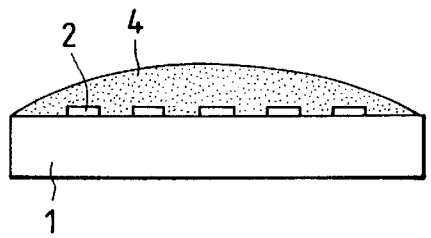
FIGS. 1(b)–1(e) are process diagrams illustrating an embodiment of a method of fabricating an electronic circuit device according to the present invention, in which an electronic part is mounted and soldered onto a ceramic board.

In FIG. 1(b), a liquid organic material 4 was supplied onto a ceramic board 1 having a connection pattern 2 formed on the surface.

Figure 1C:
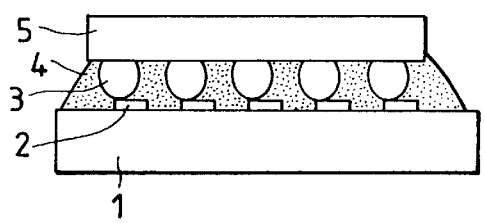

An electronic part 5, to which a solder material 3 was previously supplied, was then mounted on the connection pattern 2 of the ceramic board 1 to which the organic material 4 was supplied, as shown in FIG. 1(c). Thus, the electronic part 5 was temporarily fixed upon the ceramic board 1 by the effect of viscosity and surface tension of the organic material 4. This arrangement prevents a positional shift due to vibration caused upon transportation until bonding by reflow of the solder.

Figure 1D:
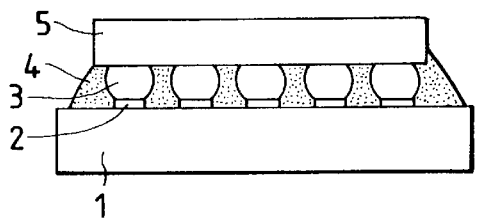

The solder 3 was then heated in accordance with the reflow profile shown in FIG. 1(a). The solder 3 was melted, leaving the bonding portion covered with the organic material 4 until the bonding was completed, as shown in FIG. 1(d). Oxidation of the solder was effectively prevented.

Moreover, since the organic material 4 of this embodiment was an alcohol, any oxide formed on the solder surface was removed by the alcohol, enhancing the wettability of the solder material 3 to the connection pattern 2. Thus, self-alignment was completed quickly, with an excellent bond.

Figure 1E:
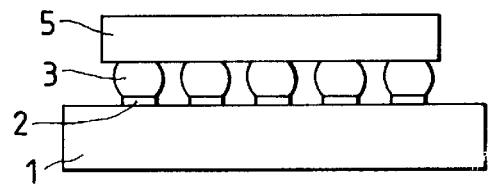

FIG. 1(e) shows that the organic material 4 was perfectly evaporated after completion of the bonding, during the cooling process. A clean bonded portion containing no residue was thus obtained, eliminating the necessity of subsequent cleaning. Notably, the atmospheric pressure may be reduced by evacuation, for example, after completion of the bonding, to permit the organic material 4 to be further positively evaporated.

FIGS. 2(a)–2(d) are sectional process diagrams illustrating a method of fabricating an electronic circuit device according to the present invention, in which an organic material is independently (that is, discontinuously) supplied for each connecting terminal.

In this embodiment, the amount of organic material 4 supplied to the bonding portions is less than that supplied in the embodiment described with reference to FIGS. 1(a)–1(e). The organic material 4 is thus required to have a higher boiling point to ensure coverage of the bonding portions until completion of soldering. Accordingly, the organic material 4 is selected such that triethylene glycol (boiling point: 285° C.) or tetraethylene glycol (boiling point: 314° C.) is used for reflow in an Ar or $N_2$ atmosphere, and a tetraethylene glycol (boiling point: 314° C.) or a pentaethylene glycol (boiling point: 370° C.) is used for reflow in an He atmosphere.

Figure 2A:
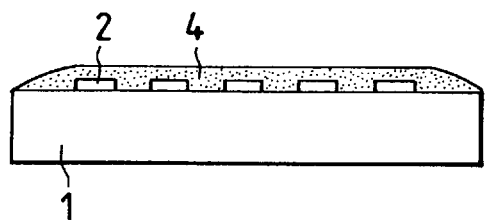
FIGS. 2(a)–2(d) are process diagrams illustrating an embodiment of a method of fabricating an electronic circuit device according to the present invention, in which an electronic part is mounted and soldered onto a ceramic board.
Figure 2B:
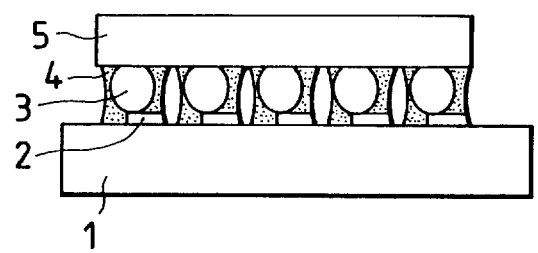

Referring to FIG. 2(a), a liquid organic material 4 was supplied to a ceramic board 1 to be thinner by comparison with the first embodiment. The thickness of the organic material 4 was set to be two-thirds or less of the thickness (height) of a solder material 3 previously supplied to an electronic part 5. Then, as shown in FIG. 2(b), when the electronic part 5 was mounted on a connection pattern 2 formed on the surface of the ceramic board 1, the organic material 4 was independent (discontinuous) for each connecting terminal, due to the effect of wettability and surface tension of the organic material.

Figure 2C:
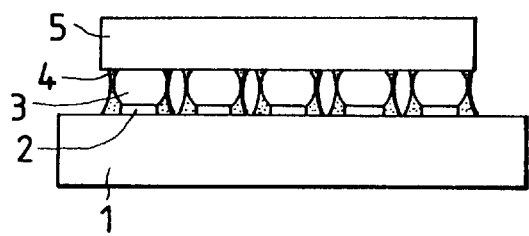

As shown in FIG. 2(c), the solder material 3 was then heated in accordance with the reflow profile of FIG. 1(a). The solder material 3 was melted, and the bonding portions left covered with the organic material 4 until the bonding was completed. Thus, the solder material 3 was effectively protected from oxidation. Moreover, by employing an alcohol as the organic material 4, oxides present on the solder surface prior to the supply of the organic material was removed. Hence, the wettability of the solder material 3 to the connection pattern 2 was enhanced, and self-alignment was generated for a short time, resulting in a good bond.

Figure 2D:
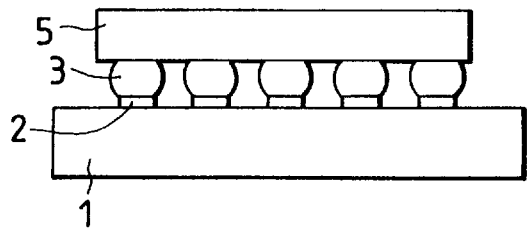

As in the previous embodiment, the organic material 4 was perfectly evaporated during the cooling process after completion of bonding, as shown in FIG. 2(d). A clean bonding portion containing no residue was thus obtained, eliminating the necessity of subsequent cleaning. The atmospheric pressure may be reduced by evacuation, for example, after completion of bonding, to allow the organic material 4 to be further positively evaporated.

A third embodiment using an organic material that is solid at room temperature will be described. A temporary fixing force of an electronic part to a board is increased by selecting such an organic material, which effectively ensures high reliability in soldering against vibrations generated between the positioning of the part to the board and the reflow of solder. The organic material may be composed of, for example, 3-phenoxy-1,2-propanediol (melting point: 55° C.) as shown in Table 1. In a conventional organic material supplying process equivalent to that shown in FIG. 1(b) or in FIG. 2(a), the organic material of the present embodiment can be smoothly supplied by heating the board 1 and the organic material 4 at a temperature higher than the melting point of the organic material. The board 1 was further heated until the organic material 4 was liquefied, and an electronic part 5 was positioned while the organic material 4 was in the liquid state. Thereafter, the organic material 4 was solidified as the board 1 was cooled to room temperature, and the electronic part 5 was thereby fixed on the board 1.

Excellent bonding was obtained in a solder reflow process, similar to that of the previously-described embodiments. Since the boiling point of the organic material 3-phenoxy-1,2-propanediol is 315° C., which sufficiently exceeds the melting point (222° C.) of a Sn3Ag solder, the bonding was performed while the organic material was in the liquid state, sufficiently covering the bonding portion.

In the cooling process following the completion of soldering, the board 1 was kept at a temperature lower than the heating temperature upon bonding and higher than the melting point of the organic material. As a result, the organic material was perfectly evaporated and removed during the cooling process.

FIGS. 3(a)–3(e) are sectional process diagrams illustrating a method of supplying ball-like solder to electrodes of an LSI in accordance with the solder-supplying method of the present invention.

Figure 3A:
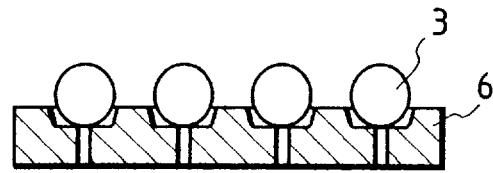
FIGS. 3(a)–3(e) are process diagrams illustrating an embodiment of the method of supplying a ball-like solder to a connecting member to be bonded according to the present invention.
Figure 3B:
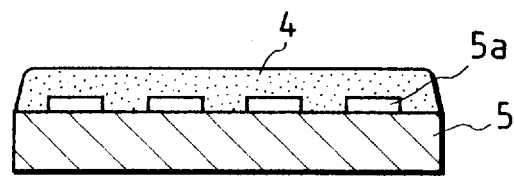

First, as shown in FIG. 3(a), an alignment jig 6 made of glass or the like, having holes formed at positions corresponding to those of electrodes 5a to be bonded using the solder, was vibrated and evacuated to receive in each hole a solder ball 3 having, for example, a eutectic composition of Sn and Pb (melting point: 183° C.). As shown in FIG. 3(b), an organic material 4 that is evaporative in a heating and melting process (for example, ethylene glycol (boiling point: 198° C.)) was applied onto the electrodes 5a of the LSI 5 by spraying or the like. In this case, the applied amount of organic material 4 was specified such that upon melting the ball-like solder 3, the remaining part of the organic material 4 sufficiently covered the surfaces of the solder balls 3 and the electrodes 5a.

Figure 3C:
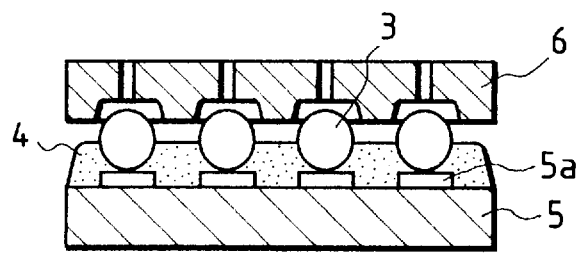
Figure 3D:
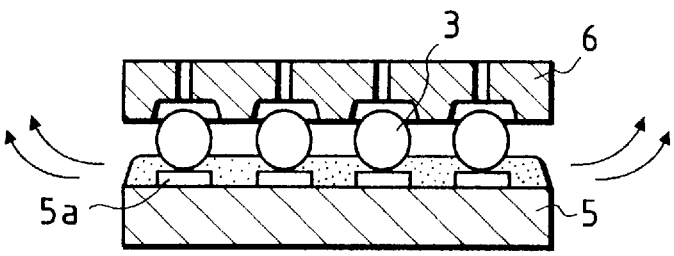

Next, as shown in FIG. 3(c), the alignment jig 6 having the solder balls 3 attached thereto by evacuation was turned over, and mounted onto the LSI 5 such that the solder balls 3 were positioned to the corresponding electrodes 5a. Then, as shown in FIG. 3(d), the solder balls 3 were heated and melted at about 220° C. At this time, an alcohol-series liquid such as ethylene glycol (the organic material 4) has a reduction function: it acts to remove initial oxide films on the surfaces of the solder balls 3. Moreover, since the surfaces of the solder balls 3 and the electrodes 5a were covered with the liquid organic material 4 until melting of the solder, they did not reoxidize. Thus, when the solder was melted, it spread in a molten state over the surface of each electrode 5a by the effects of removing the initial oxidation film of the ball-like solder 3 and of preventing the reoxidation of the ball-like solder 3 and the electrode 5a.

Figure 3E:
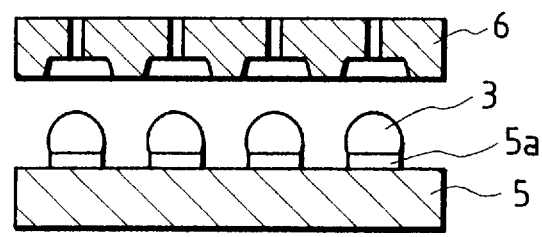

Consequently, as shown in FIG. 3(e), when the alignment jig 6 was removed, the solder balls 3 were each bonded to the corresponding electrodes 5a of the LSI 5 in a fluxless manner. Thus, it is possible to eliminate the steps of removing flux residue by cleaning, and the step of cleaning flux stuck on the alignment jig 6, as in the prior art of supplying a solder using flux. Additionally, the point of removing the alignment jig 6 (during melting of the solder balls 3) prevents deformation of the solder balls.

FIGS. 4(a)–4(e) are sectional process diagrams illustrating a method of supplying ball-like solder onto electrodes of an LSI without using a liquid organic material as described in the previous embodiment, after a surface oxide film removing process according to the present invention.

Figure 4A:
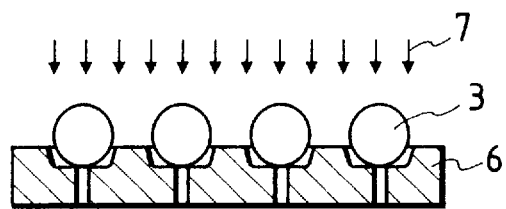
FIGS. 4(a)–4(e) are process diagrams illustrating an embodiment of a method of supplying a ball-like solder to a connecting member to be bonded according to the present invention.

First, as shown in FIG. 4(a), an alignment jig 6 having holes formed at positions corresponding to the electrodes 5a was vibrated and evacuated to receive in each hole a solder ball 3 having a eutectic composition of Sn and Ag (for example, a composition of 3.5 wt % Sn-Ag (melting point: 223° C.)), in a like manner to FIG. 3(a). Then, initial oxide films of the solder balls 3 were removed by, for example, plasma cleaning.

Figure 4B:
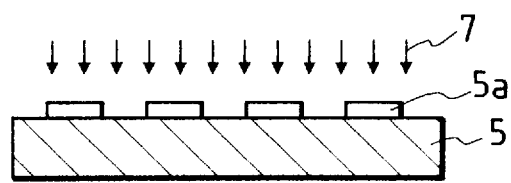

Similarly, the surfaces of the electrodes 5a of an LSI 5 were treated by plasma cleaning to remove initial oxide films and/or organic contamination films thereon, as shown in FIG. 4(b).

Figure 4C:
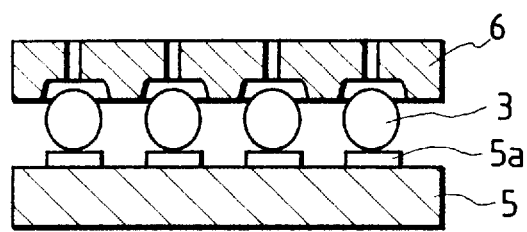
Figure 4D:
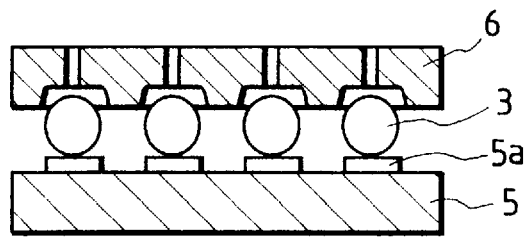

Next, as shown in FIG. 4(c), the alignment jig 6 having the solder balls 3 attached as shown in FIG. 4(a) was turned over, and mounted on the LSI 5 such that the solder balls 3 were positioned to the corresponding electrodes 5a. Then, as shown in FIG. 4(d), the solder balls 3 were heated and melted in a nonoxidizing atmosphere (for example, $N_2$ (oxygen concentration: about 10 ppm)). In this case, the peak heating temperature was set at 250° C., for example.

Figure 4E:
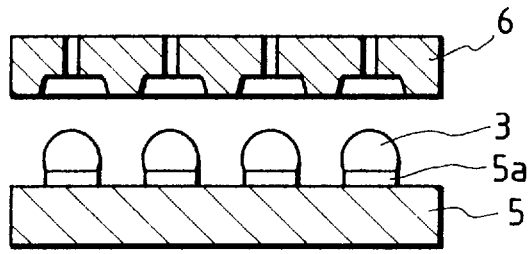

As a result of removing the surface initial oxide film and preventing reoxidation by using a nonoxiding atmosphere, when the solder 3 was melted, a thin oxide film having a thickness of several nm, formed on the surface of the solder 3, was broken, and the ball-like solder 3 was spread in a molten state over the surface of each electrode 5a. Thus, as shown in FIG. 4(e), the solder balls 3 were each supplied to the electrodes 5a of the LSI 5 in a fluxless manner.

FIGS. 5(a)–5(d) are sectional process diagrams illustrating a method of supplying solder to electrodes of an LSI by solder plating or solder depositing in accordance with the present invention.

Figure 5A:
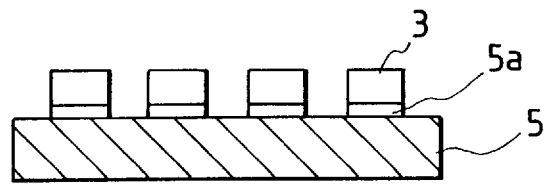
FIGS. 5(a)–5(d) are process diagrams illustrating an embodiment of a method of supplying a solder to a connecting member to be bonded by solder plating or vapor deposition.
Figure 5B:
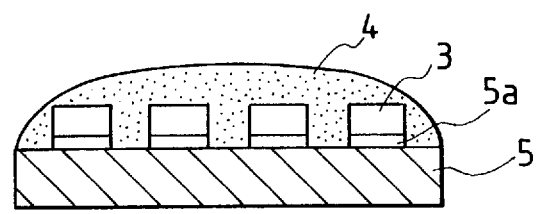
Figure 5C:
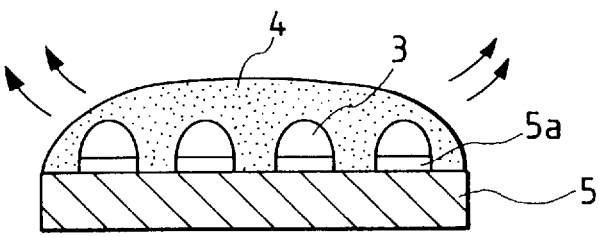

First, as shown in FIG. 5(a), solder material 3 was supplied to electrodes 5(a) of an LSI 5 by solder plating or solder depositing. An organic material 4 that is evaporative in a heating process was then supplied to the solder 3 in an amount sufficient to cover the surface of the solder 3 when the solder 3 was melted.

Next, the solder 3 was heated and melted. An organic material having a hydroxyl group in a molecule (for example, an alcohol series) acts to remove the oxide film on the surface of the solder 3 by reduction, as described with reference to the following equations (1) to (3).

First, as shown in equation 1, an organic material (R—OH) having a hydroxyl group reacts with a metal oxide (MO), and reduces the metal oxide to precipitate a metal M. The organic material is thus converted into an aldehyde (R'—CHO) having a boiling point lower than that of the organic material. Then, part of the aldehyde reacts with the metal oxide, and reduces the metal oxide to precipitate the metal again (equation 2). The aldehyde is thus converted into an organic acid (R"—COOH).

The organic acid has a boiling point higher than the original organic material, and is possibly left as a residue. The organic acid, however, comes to decarboxylation as shown in equation 3, to be reduced in boiling point, and thus evaporated without any residue. However, only a small amount of a salt which is formed by the reaction between the organic acid and the metal oxide is left as a residue, as shown in equation 4. The presence of such a salt causes no problem in the electrochemical reliability of the resulting device insofar as the amount of the residue is very small.

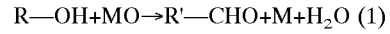
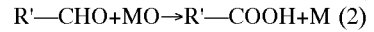

R—OH+MO→R'—CHO+M+$H_2O$ (1)

R'—CHO+MO→R'—COOH+M (2)

R'—COOH→R'—H+CO$_2$ (3)

R'—COOH+MO→R'COOM+H$_2$O (4)

Figure 5D:
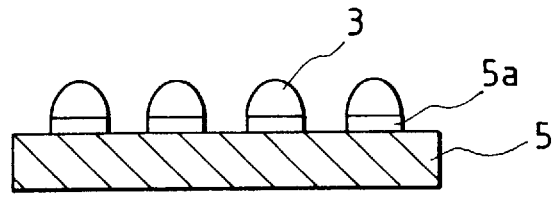

After, the reduction, the solder adopted a spherical shape by surface tension as shown in FIG. 5(d).

In a specific example of mounting an electronic part to a ceramic board using a Sn3Ag solder having a melting point of 222° C., an organic material having a boiling point greater than 222° C. is selected. More preferably, the selection of the organic material is performed in consideration of the fact that a heating atmosphere exerts an effect on the evaporating rate of the organic material. Specifically, the evaporating rate of the organic material in a He atmosphere is greater than that in an atmosphere of Ar or N$_2$. As a result, in order for the organic material in He to exhibit a state similar to that in Ar or N$_2$ at the same temperature, the boiling point of the organic material in He is required to be higher, by 20°–30° C., than that in Ar or N$_2$.

A preferred example for application of the invention is the C4 (Controlled Collapse Chip Connection) using fine solder bumps. It is desirable that the molten solder spread over the metallization on the board, and a spherical zone and self-alignment be generated by the surface tension of the molten solder. A series of such bonding steps are preferably performed in a short time. Shortening the bonding steps is effective to improve productivity due to the shortening of the "tact time", or necessary time for performing the process, and to improve the number of repairs due to reduction in the diffused amounts of solder and metallization.

The solder material used in the foregoing embodiments is not particularly limited, but may be selected from various known materials. The solder material may be generally selected from a group consisting of Sn—Pb alloys, Sn—Ag alloys, Sn—In alloys, Sn—Bi alloys, Au—Sn alloys, Au—Ge alloys, and mixtures thereof.

The organic material must have a boiling point higher than the melting point (solidus line temperature) of the solder material, and may be selected from the hydrocarbon series, ketone series, ester series, aldehyde series, and alcohol series. In particular, the alcohol series is desirable for excellent soldering because of the reducing function for removing oxides formed on the surfaces of the solder and member to be bonded. Several examples are shown in Table 1.

TABLE 1

(one atm (760 Torr))

| Material Name | Chemical Formula | Melting Point (°C.) | Boiling Point (°C.) |
|---|---|---|---|
| Propylene glycol | $CH_3CHOHCH_2OH$ | −60 | 188 |
| Ethylene glycol | $HOCH_2CH_2OH$ | −13 | 198 |
| Benzyl alcohol | $C_6H_5CH_2OH$ | −15 | 206 |
| Trimethylene glycol | $HOCH_2CH_2CH_2OH$ | −27 | 214 |
| Dipropylene glycol | $H(OC_3H_6)_2OH$ | −40 | 232 |
| 2-Phenoxyethanol | $C_6H_5(OCH_2CH_2)OH$ | −25 | 245 |
| Diethylene glycol | $H(OCH_2CH_2)_2OH$ | −7 | 245 |
| Tripropylene glycol | $H(OCH_2CH_2CH_2)OH$ | −20 | 273 |
| Triethylene glycol | $H(OCH_2CH_2)_3OH$ | −7 | 285 |
| Glycerol | $HOCH_2CHOHCH_2OH$ | 18 | 290 |
| Tetraethylene glycol | $H(OCH_2CH_2)_4OH$ | −6 | 314 |
| 3-Phenoxy-1, 2-propanediol | $C_6H_5OCH_2CHOHCH_2OH$ | 55 | 315 |
| Pentaethylene glycol | $H(OCH_2CH_2)_5OH$ | 0 | 370 |
| Hexaethylene glycol | $H(OCH_2CH_2)_6OH$ | 6 | 400 |

In summary, solder material is previously supplied to a connecting terminal of an electronic part or an electrode of a wiring circuit board, or both. An organic material is applied to the board upon bonding for positioning and temporarily fixing the electronic part on the board. The solder is then heated and melted, and the bonding completed in a state in which the surface of the bonding portion is covered with the organic material. By this method, the accuracy of solder supply is significantly improved by comparison with the prior art. The present invention therefore provides a technique essential for high density packaging in which the pitch of connecting terminals is 0.3 mm or less for external lead terminals in a QFP (Quad Flat Package), and 1 mm or less for leadless connecting terminals in a flip chip.

According to another preferred feature of the present invention, the organic material may be independently (discontinuously) applied to adjacent bonding portions when the electronic part is positioned on the board. The generation of bubbles is thereby reduced, ensuring a diffusion path for the organic material evaporated from a state in which the organic material is heated at a temperature less than the melting point of the solder from a state that the bonding is completed, preventing blasting and the consequent positional shift of the parts to be bonded. By way of example, for an organic material continuously applied between connecting terminals, external lead terminal pitch of 0.15 mm for a QFP is possible, and 0.5 mm for a flip chip is possible. For discontinuous application of organic material, even narrower pitches are obtainable.

According to the embodiments described above, the organic material (1) temporarily fixes the part mounted to the board until bonding by reflow of solder, (2) prevents the solder and the member to be bonded from being oxidized by heating in a reflow process to ensure wettability of the solder, and (3) removes oxides from the solder and bonding member surfaces, to shorten the time required for self-alignment and increasing a process margin (rigidity of control parameters, such as oxygen concentration in a reflow atmosphere, thickness of oxide films previously formed on solder or member to be bonded, etc.).

Alcohol-series organic materials are particularly suitable for achieving functions (1) and (2), as are other organic materials of the hydrocarbon series, ketone series, ester series, and aldehyde series, for example. The alcohol-series organic materials having one or more hydroxyl groups are also suited for achieving the third function. The organic material should be selected based upon the melting point of the solder used and the type of atmosphere for soldering.

Various embodiments of the invention have been disclosed in accordance with the basic features of the invention. However, various modifications will become apparent to the person of ordinary skill upon reading and understanding the disclosure. All such modifications that basically rely upon the teachings through which the invention has advanced the state of the art are properly considered within the spirit and scope of the invention.

We claim:

1. A method of soldering for use in fabricating an electronic circuit device, comprising the steps of:

presoldering a first member to be bonded to a second member;

supplying an organic material to the surface of solder material on said first member and to the surface of said second member to be bonded thereto;

aligning said solder material and said second member in an oxidizing atmosphere; and heating said solder material in a nonoxidizing atmosphere to melt it and to remove an oxide layer and contamination layer from the surface of said solder material.

2. A method of soldering as claimed in claim 1, wherein after said aligning step, said organic material remains on said first and second members.

3. A method of soldering as claimed in claim 2, wherein after said heating step, said organic material evaporates.

4. A method of soldering as claimed in claim 1, wherein the melting point of said organic material is higher than that of said solder material.

5. A method of soldering as claimed in claim 1, wherein said organic material is in a solid state at room temperature.

6. A method of soldering as claimed in claim 1, wherein said organic material is in a liquid state at room temperature.

7. A method of soldering as claimed in claim 1, wherein said organic material has a hydroxyl group in its molecules.

8. A method of soldering as claimed in claim 7, wherein after said heating step, there remains on said solder material surface only an organic acid-metal salt formed by reaction between said organic material and said solder material.

9. A method of soldering as claimed in claim 7, wherein after said heating step, there remains on said solder material surface only an organic acid-metal salt formed by reaction between said organic material, said solder material, and a surface oxide film formed on said second member.

10. A method of soldering for use in fabricating an electronic circuit device, comprising the steps of:
    supplying a solder to a first member to be bonded to a second member, in the form of solder plating, vapor deposition, or a ball-like solder;
    supplying an organic material to at least one of said first and second members;
    aligning said first and second members in an oxidizing atmosphere; and
    heating said first and second members in a nonoxidizing atmosphere to remove at least an oxide layer and a contamination layer from the surface of at least one of said solder and said second member, and for bonding said first and second members to each other.

11. A method of soldering as claimed in claim 10, wherein said solder is at least one selected from a group consisting of alloys of Pb and Sn, alloys of Sn and Ag, alloys of Au and Pb, alloys of Au and Ge, and alloys of Au and Si.

12. A method of soldering as claimed in claim 10, wherein said nonoxidizing atmosphere is prepared by supplying a nonoxidizing gas to a vacuum atmosphere.

13. A method of soldering as claimed in claim 12, wherein said nonoxidizing gas is an inert gas.

14. A method of soldering as claimed in claim 13, wherein said inert gas is selected from the group consisting of $N_2$, Ar, He, and a mixture of $N_2$, Ar, and He.

15. A method of soldering as claimed in claim 13, wherein said inert gas is selected from the group consisting of $N_2$, Ar, He, and a mixture of $N_2$, Ar, and He, and wherein said atmosphere during the heating is controlled by controlling said vacuum pressure and concentration of said inert gas.

16. A method of soldering as claimed in claim 12, wherein said nonoxidizing gas is a reducing gas.

17. A method of soldering as claimed in claim 12, wherein said nonoxidizing gas is an active gas.

18. A method of soldering as claimed in claim 17, wherein said active gas is selected from the group consisting of (1) a mixture of $N_2$ and said inert gas and (2) $N_2$.

19. A method of soldering as claimed in claim 12, wherein said nonoxidizing gas is a fluorocarbon vapor.

20. A method of soldering as claimed in claim 10, wherein after said aligning step, said organic material remains on said first and second members.

21. A method of soldering as claimed in claim 20, wherein after said heating step, said organic material evaporates.

22. A method of soldering as claimed in claim 10, wherein the melting point of said organic material is higher than that of said solder.

23. A method of soldering as claimed in claim 10, wherein said organic material is in a solid state at room temperature.

24. A method of soldering as claimed in claim 10, wherein said organic material is in a liquid state at room temperature.

25. A method of soldering as claimed in claim 10, wherein said organic material has a hydroxyl group in its molecules.

26. A method of soldering as claimed in claim 12, wherein said atmosphere during the heating step is controlled by controlling said vacuum pressure and concentration of said gas, and wherein after said heating step, said organic material evaporates.

27. A method of soldering as claimed in claim 10, wherein said step of supplying a solder supplies the solder in the form of solder plating or vapor depositioning.

28. A method of soldering as claimed in claim 10, wherein after said heating step, there remains on said solder surface only an organic acid-metal salt formed by reaction between said organic material and said solder.

29. A fluxless bonding method for bonding together first and second members of an integrated circuit, comprising the steps of:
    supplying a solder to at least one of the first and second members in the form of solder plating, vapor depositioning, or a ball-like solder;
    supplying an organic material to at least one of said first and second members;
    aligning said first and second members in an oxidizing atmosphere; and
    heating said first and second members in a nonoxidizing atmosphere to remove an oxide layer and a contamination layer from the surface of one of said solder and said first and second members, and for bonding said first and second members to each other.

30. A method of soldering as claimed in claim 29, wherein after said aligning step, said organic material remains on said first and second members.

31. A method of soldering as claimed in claim 30, wherein after said heating step, said organic material evaporates.

32. A method of soldering as claimed in claim 29, wherein the melting point of said organic material is higher than that of said solder.

33. A method of soldering as claimed in claim 29, wherein said organic material is in a solid state at room temperature.

34. A method of soldering as claimed in claim 29, wherein said organic material is in a liquid state at room temperature.

35. A method of soldering as claimed in claim 29, wherein said organic material has a hydroxyl group in its molecules.

36. A method of soldering as claimed in claim 29, wherein said step of supplying a solder supplies said solder by solder plating or vapor depositioning.

37. A method of soldering as claimed in claim 29, wherein after said heating step, there remains on said solder surface only an organic acid-metal salt formed by reaction between said organic material and said solder.

* * * * *